(12) United States Patent
Mora Puchalt et al.

(10) Patent No.: US 11,664,814 B2
(45) Date of Patent: May 30, 2023

(54) VOLTAGE INTERPOLATOR

(71) Applicant: Analog Devices International Unlimited Company, Limerick (IE)

(72) Inventors: Gerard Mora Puchalt, Catarroja (ES); Italo Carlos Medina Sánchez Castro, Valencia (ES); Jesús Bonache Martinez, Mutxamel (ES)

(73) Assignee: Analog Devices International Unlimited Company, Limerick (IE)

( * ) Notice: Subject to any disclaimer, the term of this patent is extended or adjusted under 35 U.S.C. 154(b) by 145 days.

(21) Appl. No.: 17/461,400

(22) Filed: Aug. 30, 2021

(65) Prior Publication Data

US 2023/0064761 A1    Mar. 2, 2023

(51) Int. Cl.
*H03M 1/20* (2006.01)
*G06G 7/30* (2006.01)
*H03F 3/45* (2006.01)
*H03M 1/36* (2006.01)

(52) U.S. Cl.
CPC ............. *H03M 1/203* (2013.01); *G06G 7/30* (2013.01); *H03F 3/45183* (2013.01); *H03M 1/365* (2013.01)

(58) Field of Classification Search
CPC ...................... H03M 120/30; H03M 120/36
See application file for complete search history.

(56) References Cited

U.S. PATENT DOCUMENTS

| | | | | |
|---|---|---|---|---|
| 4,321,515 A | * | 3/1982 | Honda | G11B 15/103 318/7 |
| 5,594,326 A | * | 1/1997 | Gilbert | G05F 3/227 323/315 |
| 6,078,169 A | | 6/2000 | Petersen | |
| 6,246,351 B1 | * | 6/2001 | Yilmaz | H03M 1/0682 341/145 |
| 6,359,498 B1 | * | 3/2002 | Kurihara | H03G 1/04 330/289 |
| 6,583,667 B1 | * | 6/2003 | Dasgupta | H03F 3/45197 330/254 |
| 6,614,379 B2 | | 9/2003 | Lin et al. | |
| 7,049,875 B2 | * | 5/2006 | Tsividis | H03H 11/245 327/334 |

(Continued)

FOREIGN PATENT DOCUMENTS

| | | |
|---|---|---|
| CN | 100578601 C | 1/2010 |
| CN | 202085133 U | 12/2011 |
| CN | 115733495 | 3/2023 |

OTHER PUBLICATIONS

Mangelsdorf, Christopher W, "A Little in Front O' The Next", IEEE Solid-State Circuits Magazine, (Aug. 16, 2013), 29-34.

(Continued)

*Primary Examiner* — Lam T Mai
(74) *Attorney, Agent, or Firm* — Schwegman Lundberg & Woessner, P.A.

(57) ABSTRACT

Techniques for interpolating two voltages without loading them and without requiring significant power or additional area are described. The techniques include specific topologies for the buffering amplifiers that offer accuracy by cancelling systematic error sources without relying on high gain, thus simplifying the frequency compensation, and reducing power consumption. This can be achieved by biasing the amplifiers from the load current by an innovative feedback structure, which can remove the need for high impedance nodes inside the amplifiers.

20 Claims, 7 Drawing Sheets

(56) References Cited

U.S. PATENT DOCUMENTS

| | | | |
|---|---|---|---|
| 7,078,969 B2 | 7/2006 | Bhattacharjee et al. | |
| 7,382,190 B2 | 6/2008 | Gilbert | |
| 7,443,234 B2 | 10/2008 | Iriguchi | |
| 7,541,844 B2 | 6/2009 | Chiu et al. | |
| 7,576,608 B1 | 8/2009 | Huang | |
| 7,616,144 B2 | 11/2009 | Mulder et al. | |
| 7,773,013 B1 | 8/2010 | Williams et al. | |
| 8,106,806 B2 | 1/2012 | Toyomura et al. | |
| 8,130,035 B2 * | 3/2012 | Weigandt | H03F 1/3211 330/261 |
| 8,130,131 B2 | 3/2012 | Nakajima | |
| 8,289,009 B1 * | 10/2012 | Strik | G05F 1/575 323/280 |
| 8,643,437 B2 | 2/2014 | Chiu et al. | |
| 8,970,573 B2 | 3/2015 | Knausz et al. | |
| 9,160,345 B1 * | 10/2015 | Gorecki | H04L 7/04 |
| 9,847,788 B2 | 12/2017 | Lye et al. | |
| 10,310,530 B1 * | 6/2019 | Lu | G05F 1/468 |
| 10,447,508 B2 | 10/2019 | Sreeramaneni et al. | |
| 2002/0080056 A1 | 6/2002 | Karanicolas | |
| 2003/0011349 A1 * | 1/2003 | Kuroiwa | G05F 3/265 323/281 |
| 2003/0141999 A1 | 7/2003 | Scholtens | |
| 2004/0021450 A1 * | 2/2004 | Wrathall | H02M 3/156 323/282 |
| 2005/0110571 A1 * | 5/2005 | Imayama | H03G 3/3042 330/254 |
| 2008/0278200 A1 * | 11/2008 | Chiu | H03M 1/68 327/103 |
| 2009/0115461 A1 * | 5/2009 | Okada | H03F 3/45197 330/252 |
| 2012/0200479 A1 * | 8/2012 | Færevaag | G09G 3/3696 345/84 |
| 2012/0313701 A1 * | 12/2012 | Khlat | H02M 3/07 330/127 |
| 2013/0147448 A1 | 6/2013 | Kadanka | |
| 2013/0293405 A1 * | 11/2013 | Medina Sanchez-Castro | H03M 1/687 341/154 |
| 2014/0009200 A1 * | 1/2014 | Kay | H03F 3/505 327/281 |
| 2014/0009227 A1 * | 1/2014 | Kay | H03F 3/45475 330/127 |
| 2014/0111010 A1 * | 4/2014 | Kumar | G06F 1/329 307/31 |
| 2014/0266105 A1 * | 9/2014 | Li | G05F 1/565 323/280 |
| 2017/0155367 A1 * | 6/2017 | Watanabe | H03F 1/32 |
| 2017/0276710 A1 * | 9/2017 | Kumar | G01R 19/04 |
| 2021/0050830 A1 * | 2/2021 | Wang | H03F 3/45183 |
| 2022/0190926 A1 * | 6/2022 | Lozsef | H04B 10/07 |

OTHER PUBLICATIONS

Sackinger, Eduard, et al., "A versatile building block: the CMOS differential difference amplifier", IEEE Journal of Solid-State Circuits, 22(2), (Apr. 1987), 287-294.

"European Application Serial No. 22192003.6, Extended European Search Report dated Jan. 24, 2023", 11 pgs.

Fornasari, Andrea, "A second-order multi-bit [Sigma][Delta] modulator with on-line calibration and digital correction of the digital-to-analog converter mismatches", Analog Integrated Circuits and Signal Processing, Kluwer Academic Publishers, BO, vol. 62, No. 2, (Jul. 15, 2009), 193-204.

* cited by examiner

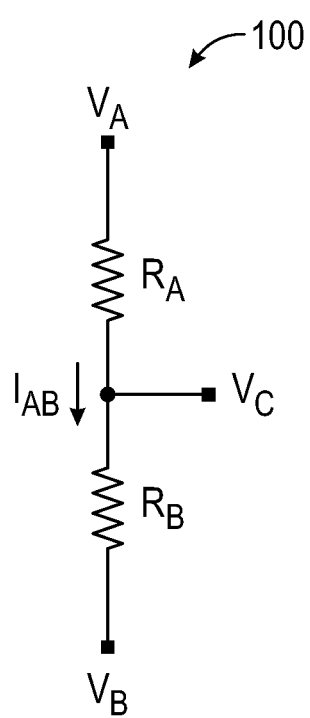 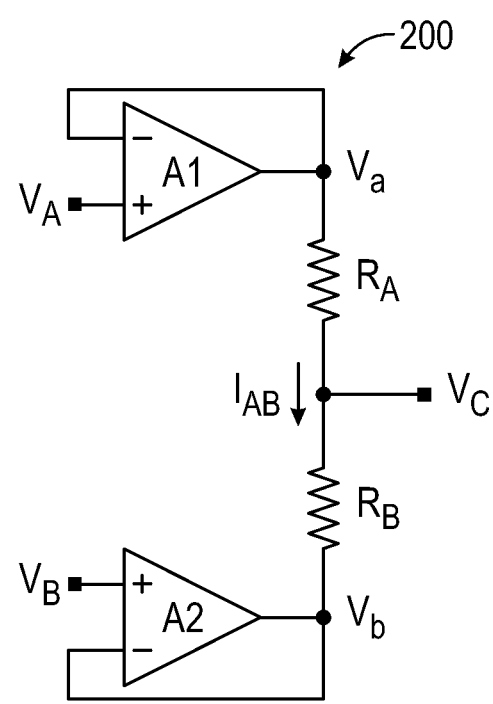
FIG. 1  FIG. 2

VOLTAGE INTERPOLATOR

FIELD OF THE DISCLOSURE

This document pertains generally to analog signal processing techniques.

BACKGROUND

The average or, more generally, the interpolation of two voltages is often needed in analog signal processing. For instance, the interpolation of two voltages can be used as a reference voltage for a signal conversion, such as the reference interpolation in a Flash converter. As another example, the interpolation of two voltages can be used for biasing purposes. For example, interpolation can be used to define in a fully differential amplifier, based on two biasing voltages from its core, the optimum value to regulate its output common mode level to allow for maximum output signal swing.

SUMMARY OF THE DISCLOSURE

This disclosure is directed to, among other things, techniques for interpolating two voltages without loading them and without requiring significant power or additional area. Described are specific topologies for the buffering amplifiers that offer accuracy by cancelling systematic error sources without relying on high gain, thus simplifying the frequency compensation, and reducing power consumption. This can be achieved by biasing the amplifiers from the load current by an innovative feedback structure, which can remove the need for high impedance nodes inside the amplifiers.

In some aspects, this disclosure is directed to a circuit to generate an output voltage, the circuit comprising: a voltage divider including at least a first resistive device and a second resistive device, wherein the output voltage is generated at a node along the voltage divider; a first closed-loop amplifier circuit to: drive a first terminal (Va) of the voltage divider; and receive a first reference voltage (VA), wherein the first closed-loop amplifier circuit is configured to derive first biasing currents from a current through the voltage divider; and a second closed-loop amplifier circuit to: drive a second terminal (Vb) of the voltage divider; and receive a second reference voltage (VB), wherein the second closed-loop amplifier circuit is configured to derive second biasing currents from the current through the voltage divider.

In some aspects, this disclosure is directed to a method of generating an output voltage using a circuit including a voltage divider having at least a first resistive device and a second resistive device, wherein the output voltage is generated at a node along the voltage divider, the method comprising: driving a first terminal (Va) of the voltage divider; receiving a first reference voltage (VA); deriving first biasing currents from a current through the voltage divider; driving a second terminal (Vb) of the voltage divider; receiving a second reference voltage (VB); and deriving second biasing currents from the current through the voltage divider.

In some aspects, this disclosure is directed to a circuit to generate an output voltage, the circuit comprising: a voltage divider including at least a first resistive device and a second resistive device, wherein the output voltage is generated at a node along the voltage divider; a first closed-loop amplifier circuit including a first output transistor driving the voltage divider and having a first gate terminal, the first closed-loop amplifier circuit to: drive a first terminal (Va) of the voltage divider; and receive a first reference voltage (VA), wherein the first closed-loop amplifier circuit is configured to derive first biasing currents from a current through the voltage divider; and a second closed-loop amplifier circuit to: drive a second terminal (Vb) of the voltage divider; and receive a second reference voltage (VB), wherein the second closed-loop amplifier circuit is configured to derive second biasing currents from the current through the voltage divider, wherein the first closed-loop amplifier circuit includes a first tail current circuit to generate a first tail current in response to a voltage at the first gate terminal of the first output transistor, and wherein the first tail current is a scaled version of the current through the voltage divider.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 is an example of a voltage divider to generate an interpolation of two voltages.

FIG. 2 is an example of a voltage divider circuit buffered by closed-loop amplifiers to generate an interpolation of two voltages.

DETAILED DESCRIPTION

Figure 3:
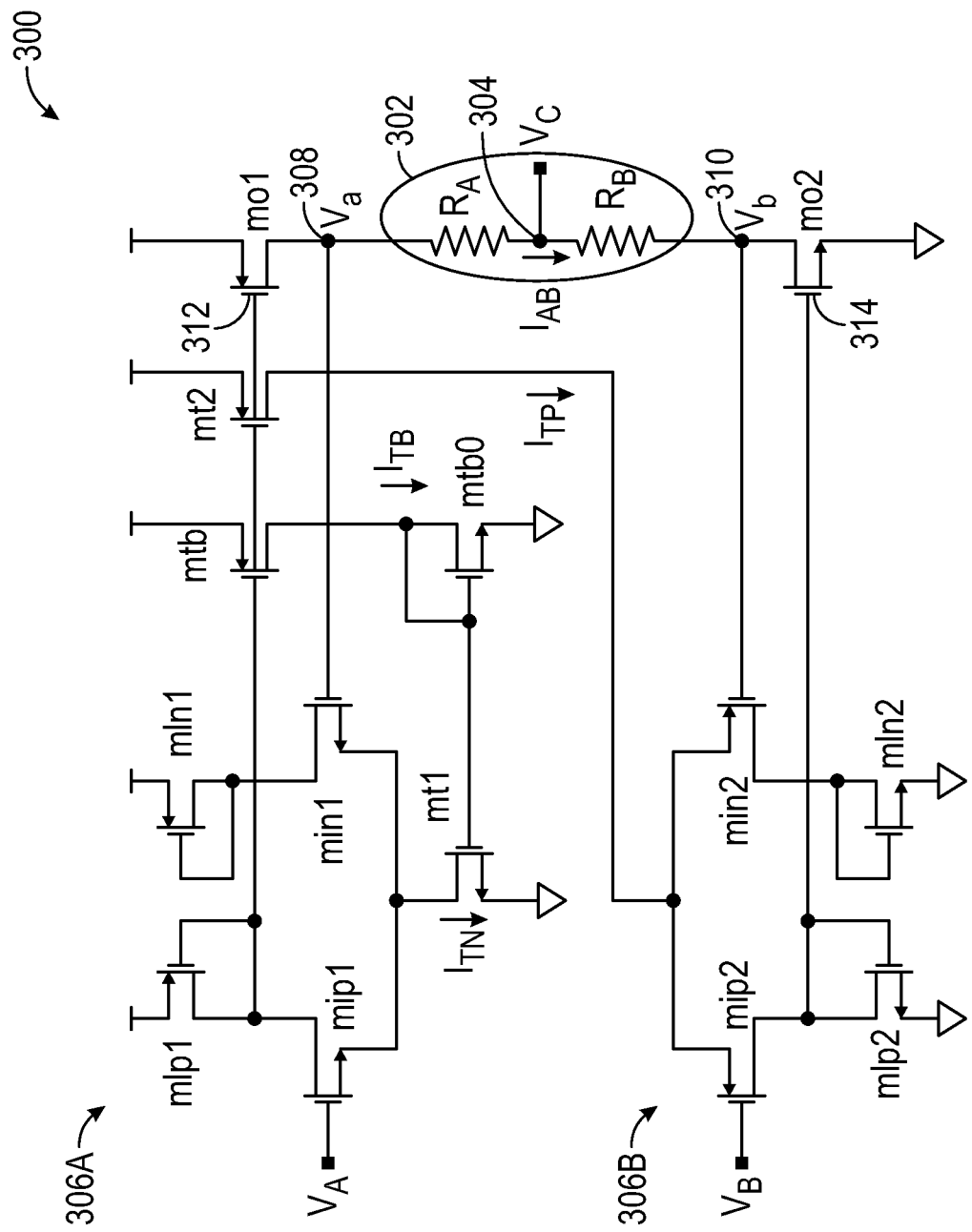
FIG. 3 is an example of a circuit to generate an interpolated voltage using various techniques of this disclosure.

The average or, more generally, the interpolation of two voltages is often needed in analog signal processing. Existing approaches to interpolate between two reference voltages can either load the reference voltages or buffer the reference voltages. The approaches that prevent the loading of the reference voltages can require demanding amplifiers in terms of frequency compensation and/or power consumption, or these approaches use undemanding amplifiers but at the expense of substantial inaccuracy in the interpolated voltage.

To prevent loading of the reference voltages, amplifier circuits can buffer the reference voltages and, to keep the accuracy of the generated average voltage, negative feedback can be provided around the buffering function. However, such an approach can require significant power and frequency compensation to perform adequately.

The present inventors have recognized a need for a solution for interpolating two voltages without loading them and without requiring significant power or additional area. This disclosure describes, among other things, specific topologies for the buffering amplifiers that offer accuracy by cancelling systematic error sources without relying on high gain, thus simplifying the frequency compensation, and reducing power consumption. This can be achieved by biasing the amplifiers from the load current by an innovative feedback structure, which can remove the need for high impedance nodes inside the amplifiers.

FIG. 1 is an example of a voltage divider to generate an interpolation of two voltages. The simplest approach to generate an average voltage is to use a resistive voltage divider 100 (also referred to in this disclosure as a "voltage divider") with reference voltages $V_A$ and $V_B$ ($V_A \geq V_B$) driving the voltage divider 100, and a voltage $V_C$ tapped at an intermediate node, as shown in FIG. 1.

The intermediate node divides the total resistance $R_T$ of the voltage divider into two segments of equivalent resistance $R_A$ and $R_B$ ($R_T=R_A+R_B$), as shown in FIG. 1. Applying Kirchhoff's circuit laws and assuming that the voltage $V_C$ is interfaced to a high-impedance node, the resulting voltage $V_C$ is as shown in Eq. 1:

$$V_C = \frac{R_B \cdot V_A + R_A \cdot V_B}{R_T} = \frac{R_B}{R_T} \cdot \left( V_A + \frac{R_A}{R_B} \cdot V_B \right) = \frac{R_B \cdot V_A + R_A \cdot V_B}{R_A + R_B} \quad \text{(Eq. 1)}$$

The voltage $V_C$ can adopt any value between the voltages $V_A$ and $V_B$ by adjusting the relative size of $R_A$ and $R_B$. Applying Eq. 1 to the specific case for which $R_A$ and $R_B$ are nominally equal ($R_A \approx R_B = R$), the voltage $V_C=(V_A+V_B)/2$ becomes the average of voltages $V_A$ and $V_B$.

The current $I_{AB}$ flowing through $R_A$ and $R_B$ would be the same $I_{AB}$ (again, assuming that $V_C$ is interfaced to a high-impedance node) and set by the total resistance $R_T$ of the voltage divider by means of the Ohm's law.

$$I_{AB} = \frac{V_A - V_B}{R_T} = \frac{V_A - V_B}{R_A + R_B} \quad \text{(Eq. 2)}$$

The current established by Eq. 2 represents the loading experienced by the reference voltages $V_A$ and $V_B$ due to the presence of the resistive voltage divider (see FIG. 1). In general, such loading $|I_{AB}|>0$ is undesirable because it can impact the performance of the circuits providing the reference voltages $V_A$ and/or $V_B$. As a result, the accuracy of the generated average at the intermediate node can be diminished.

A solution to reduce $|I_{AB}|$ and, therefore, the loading effect of the resistive voltage divider can be to increase the total resistance $R_T$ of the resistive voltage divider, such as keeping the ratio $R_A/R_B$ to offer the same voltage $V_C$. However, if the accuracy of the generated average voltage is to be competitive, this approach implies the use of potentially huge resistors in value and, for practical technologies, also in area. As a result, the required thermal noise, layout area and/or layout parasitics can become prohibitive.

FIG. 2 is an example of a voltage divider circuit buffered by closed-loop amplifiers to generate an interpolation of two voltages. The circuit 200 of FIG. 2 includes a resistive voltage divider, such as the resistive voltage divider 100 of FIG. 1, and two amplifier (buffer) circuits A1, A2 to buffer the reference voltages $V_A$ and $V_B$ before applying them to the voltage divider, thus preventing the loading of the reference voltages $V_A$ and $V_B$ by having the amplifier circuits supply the current $I_{AB}$. In this approach, a dedicated buffer can be applied to each reference voltage. The circuit implementing each buffer can be different and optimized to the expected range of each reference voltage.

In some examples, this can be accomplished by using open-loop amplifiers, such as using a source-follower topology. However, the imperfections of the open-loop amplifiers (in particular, due to the possible level shifting of their outputs) can cause the reference voltages effectively applied ($V_a$ and $V_b$) to the voltage divider to be inaccurate. This limitation can be overcome by replacing the open-loop amplifiers with closed-loop amplifiers (A1 and A2) with sufficiently high gain, as shown in FIG. 2.

In general, the use of closed-loop amplifiers in this context, such as by using operational amplifiers in unity gain configuration by means of negative feedback, implies a substantial cost in terms of area, power and/or complexity of frequency compensation. The present inventors have recognized a need for a voltage interpolator that does not load the reference voltages and that offers an accuracy comparable to the one achievable using traditional closed-loop amplifiers, but without incurring their overhead.

This disclosure describes various topologies for buffering closed-loop amplifiers that provide a competitive accuracy without relying on a significant open-loop gain and that can offer a solution for an accurate voltage interpolator without costly frequency compensation schemes (due its relatively low open-loop gain) and, thus, without significant cost in terms of area and power. Such a closed-loop amplifier can be built from a topology that does not rely on internal high impedance nodes. As a result, independent current sources are not used for the biasing of the amplifier and, hence, the current level of its branches can be defined by a feedback loop from an active current. In such a case, the load current can be conveniently used to define the biasing of the internal branches of the amplifier.

For the voltage interpolator of FIG. 2, the load current $I_{AB}$ is defined according to Eq. 2 by the total resistance of the resistor string and one amplifier (A1) will source the load current $I_{AB}$ while the other amplifier (A2) will sink it. Therefore, since the load current $I_{AB}$ is well controlled by the design parameters, the amplifiers of the buffered voltage interpolator are good candidates to be biased from the load current $I_{AB}$ and, since they are linked by the same load, they may advantageously share some structures. These considerations lead to the circuit shown in FIG. 3.

FIG. 3 is an example of a circuit to generate an interpolated voltage using various techniques of this disclosure. The circuit 300 of FIG. 3 can generate an output voltage $V_C$, e.g., an interpolated output voltage. The circuit 300 can include a voltage divider 302 including at least a first resistive device $R_A$ and a second resistive device $R_B$, where the output voltage $V_C$ is generated at a node 304 along the voltage divider 302.

The circuit 300 can include a first closed-loop amplifier circuit, shown generally at 306A, and a second closed-loop amplifier circuit 306B. The first closed-loop amplifier circuit 306A can be formed by transistors mip1, min1, mlp1, mln1, mo1, mt1, mtb0, and mt2 and can drive a first terminal 308 of the voltage divider 302. The first closed-loop amplifier circuit 306A can receive a first reference voltage VA by the transistor mip1 without loading the first reference voltage $V_A$ at the frequencies of interest. The output voltage Va can be fed back to the transistor min1. The first closed-loop amplifier circuit 306A can be configured to derive first biasing currents from a current $I_{AB}$ through the voltage divider 302, as described in more detail below.

The second closed-loop amplifier circuit 306B, can be formed by transistors mip2, min2, mlp2, mln2, mo2, and mt2 and can drive a second terminal 310 of the voltage divider 302. The second closed-loop amplifier circuit 306B can receive a second reference voltage $V_B$ by the transistor mip2 without loading the second reference voltage $V_B$ at the frequencies of interest. The output voltage Vb can be fed back to the transistor min2. It is assumed $V_A \geq V_B$, without loss of generality. The second closed-loop amplifier circuit 306B can be configured to derive second biasing currents from the current $I_{AB}$ through the voltage divider 302, as described in more detail below. In FIG. 3, the output voltage $V_C$, e.g., an interpolated output voltage, is between the output voltage Va of the first closed-loop amplifier 306A and the output voltage Vb second closed-loop amplifier Vb.

In some examples, at least one of the first closed-loop amplifier circuit 306A and the second closed-loop amplifier circuit 306B can include a differential amplifier circuit. For example, the input stage of the first closed-loop amplifier circuit 306A can be formed by a differential input transistor pair mip1-min1, a differential load transistor pair mlp1-min1, and a tail current source transistor mt1. The first closed-loop amplifier circuit 306A can be a simple differential amplifier with passive load that drives the output stage transistor mo1 of the first closed-loop amplifier circuit 306A. A negative feedback loop can be formed by transistors min1, mip1, and mo1 and can force, assuming it is stable, the reference voltage $V_A$ value into the output of the first closed-loop amplifier circuit 306A (which is one of the extremes $V_a$ of the voltage divider 302), while the output transistor mo1 delivers the corresponding load current $I_{AB}$.

The load current $I_{AB}$ is set by the total resistance in the voltage divider 302. The techniques of FIG. 3, for example, can capture any variation in the load current $I_{AB}$ by a variation in the tail current $I_{TN}$. The effect is to balance the voltage at the load of the input stage of the first closed-loop amplifier circuit 306A, e.g., at the drains of the input transistor pair mip1-min1, which can result in an even distribution of tail current $I_{TN}$ and improved accuracy.

There are two negative feedback loops in the top portion of FIG. 3: a first negative feedback loop through the transistors mo1 and min1 and a second through the tail current circuit. Two similar negative feedback loops are present in the bottom portion of FIG. 3. The feedback loop that monitors the load current $I_{AB}$ forces the even distribution of the tail current in the input stage of the first closed-loop amplifier circuit 306A. If imbalances exist at the drains of the input transistor pair mip1-min1, then the load current $I_{AB}$ changes and the tail current IN changes.

As mentioned above, the first closed-loop amplifier circuit 306A can be configured to derive first biasing currents from a current through the voltage divider 302. For example, first biasing currents for the transistors mip1 and min1 in FIG. 3 can be generated from a first tail current $I_{TN}$. The first closed-loop amplifier circuit 306A can include a first tail current circuit, e.g., transistors mtb, mtb0, and mt1, to provide the first tail current $I_{TN}$. The transistor mtb and mtb0 can form an extra branch to generate the first tail current IN from the gate voltage of the first output transistor mo1. The first tail current $I_{TN}$ provided by the transistor mt1 for the operation of the differential input pair mip1-min1 in the input stage of the first closed-loop amplifier circuit 306A is a scaled version of the load current $I_{AB}$ through the voltage divider 302, after being conveyed by transistors mtb and mtb0 through current mirroring.

The first closed-loop amplifier circuit 306A can include a first output transistor mo1 driving the voltage divider 302 and having a first gate terminal 312. The first tail current circuit can generate the first tail current IN in response to a voltage at the first gate terminal 312 of the first output transistor mo1. This additional negative feedback loop can balance the input stage loads by making their bias currents track the load current $I_{AB}$, thus helping mitigate the systematic errors that would prevent the output voltage $V_a$ from approaching the first reference voltage $V_A$ without the need for significant open-loop gain in the first closed-loop amplifier circuit 306A.

Similarly, the second closed-loop amplifier circuit 306B can include a differential amplifier circuit in some example configurations. For example, the input stage of the second closed-loop amplifier circuit 306B can be formed by the differential input transistor pair mip2-min2, its differential load transistor pair mlp2-min2, and its tail current source transistor mt2. The second closed-loop amplifier circuit 306B can be a simple differential amplifier with passive load that drives the output stage of the second closed-loop amplifier circuit 306B formed by the transistor mo2. The negative feedback loop formed by transistors min2, mip2 and mo2 forces, assuming it is stable, the second reference voltage $V_B$ value into the output of the second closed-loop amplifier circuit 306B (which is one of the extremes $V_b$ of the voltage divider 302), while the output transistor mo2 delivers the corresponding load current $I_{AB}$. The second closed-loop amplifier circuit 306B can include a second output transistor mo2 driving the voltage divider 302 and having a second gate terminal 314.

The second closed-loop amplifier circuit 306B can be configured to derive second biasing currents from the current through the voltage divider 302. For example, second biasing currents for the transistors mip2 and min2 in FIG. 3 can be generated from a second tail current $I_{TP}$. The second closed-loop amplifier circuit 306B can include a second tail current circuit, e.g., transistor mt2, to provide the second tail current I-P. The second tail current $I_{TP}$ provided by the transistor mt2 for the operation of the differential input pair mip2-min2 in the input stage of the second closed-loop amplifier circuit 306B is a scaled version of the load current $I_{AB}$ through the voltage divider 302. The second tail circuit can generate the second tail current $I_{TP}$ in response to a voltage at the first gate terminal 312 of the first output transistor mo1.

Complementary output transistors mo1 and mo2 can drive the load (in this case, the voltage divider 302) in such a way that the load current $I_{AB}$ flowing through them approaches the current given by Eq. 2. Ignoring the possible residual errors, the action of the first closed-loop amplifier circuit 306A and the second closed-loop amplifier circuit 306B can produce $V_a \approx V_A$ and $V_b \approx V_B$, respectively. Therefore, the output voltage $V_C$, e.g., an interpolated output voltage, can follow Eq. 1 as targeted.

In the approach represented by FIG. 3, frequency compensation is secondary and, in general, optional due to its topological simplicity and relatively low open-loop gain derived from the lack of high-impedance nodes. In other approaches, however, frequency compensation would be a critical consideration and a significant cost in terms of circuitry if traditional amplifiers are used in schemes like the one in FIG. 2.

In some examples, the circuits of this disclosure can include a resistive voltage divider based on resistors. However, other resistive devices, such as diodes, can be used instead of resistors if they comply with a desired matching relation.

The resistive voltage divider can accept some modifications to expand its functionality. For example, dividing it into several elements in series to make more interpolation tap voltages available, or adding resistor strings in parallel to accomplish several effects. Also, currents can be strategically injected at given nodes of the voltage divider to produce shifts in the output voltage. The solution resulting from such modifications does not depart from the spirit of the disclosed techniques.

Having additional interpolating tap voltages available can motivate the introduction of the means to select a given one as the output of the voltage interpolator, such as part of a calibration scheme or a technique for digital enhancement. The possible gain applied to the voltage references by the amplifiers working as buffers may be also subject to calibration. Again, the principle of operation of the disclosed idea would be preserved in such a case.

As a design note, the self-biasing nature of the amplifiers in FIG. 3 can imply the desirability for start-up circuits to guarantee a valid initial solution for the loops, a usual consideration in the state-of-the-art.

In conclusion, the circuit shown in FIG. 3, for example, can buffer the reference voltages, offer competitive accuracy, and does not require demanding compensation techniques and/or power consumption as is the case using other techniques.

Figure 4:
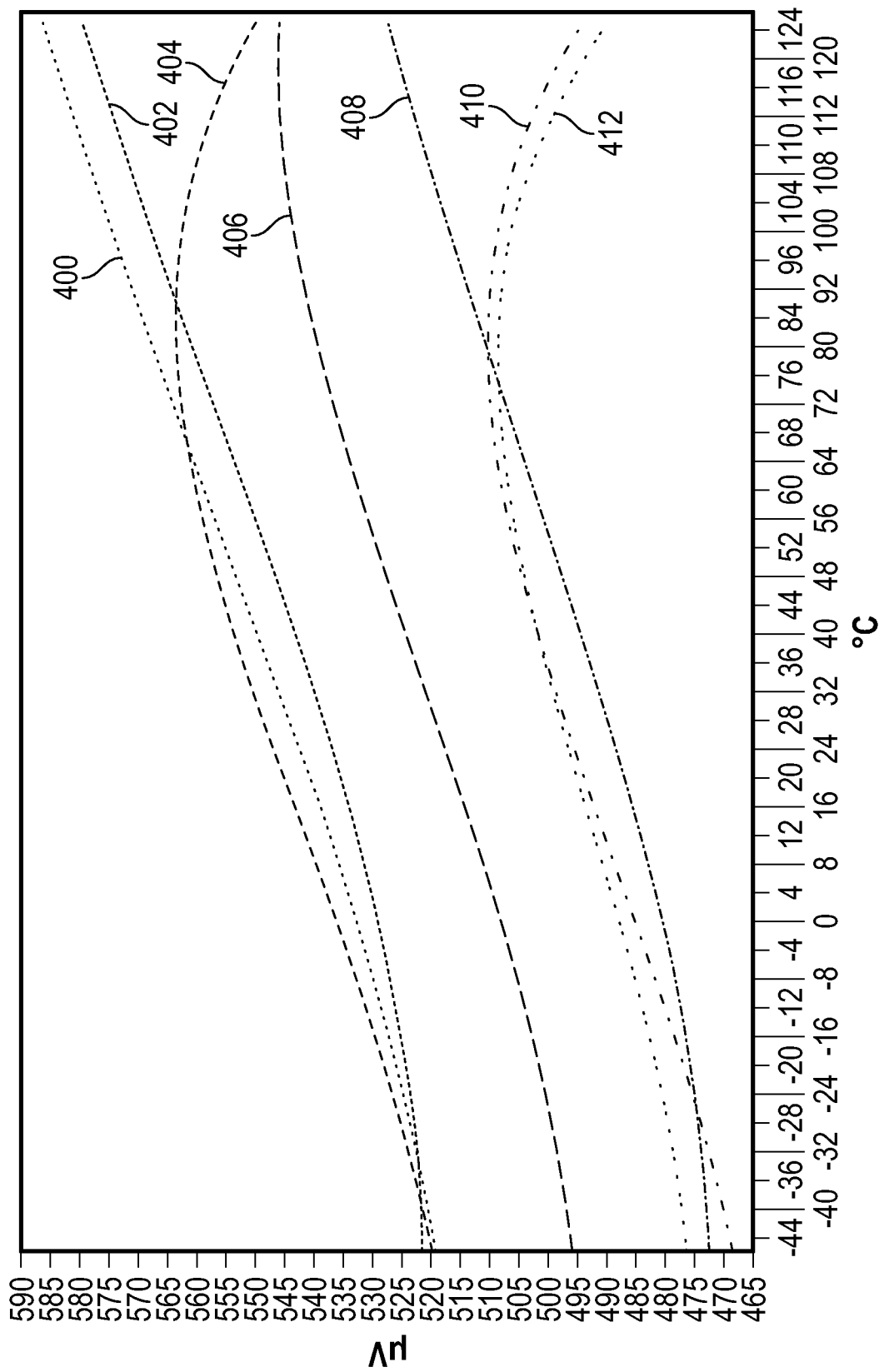
FIG. 4 depicts DC error from the ideal average of the circuit of FIG. 3 simulated across process and temperature variability.

FIG. 4 depicts DC error from the ideal average (~1V) of the circuit of FIG. 3 simulated across process and temperature variability. The x-axis represents temperature in degrees Celsius and the y-axis represents the output error voltage in microvolts. Each of the curves 400-412 represents a different process corner in the semiconductor manufacturing of the circuit of FIG. 3. The curve 406 represents the nominal output voltage of the circuit of FIG. 3 with an expected fabrication accuracy.

The obtained error is well confined around ~520 µV as shown by FIG. 4. Assuming, hence, a relative error of 520 µV/1V=520µ, the equivalent open-loop DC gain of the combined amplifiers of the simulated voltage interpolator can be roughly estimated as $20 \cdot \log_{10}(1/520\mu) \approx 66$ dB.

However, simulating (again, across process and temperature variability) the AC behavior of the same voltage interpolator, the obtained differential mode open-loop DC gain G is below ~18 dB, showing how an accuracy equivalent to the one of a traditional amplifier (with a gain of ~66 dB, according to the estimate from FIG. 4) can be obtained with less open-loop gain by the use of the circuit shown in FIG. 3 and its intrinsic capability to cancel systematic errors to boost the accuracy. This relatively low open-loop gain G allows an acceptable stability without applying explicit compensations techniques. For example, simulations have shown a differential mode open-loop phase margin PM>45°.

Figure 5:
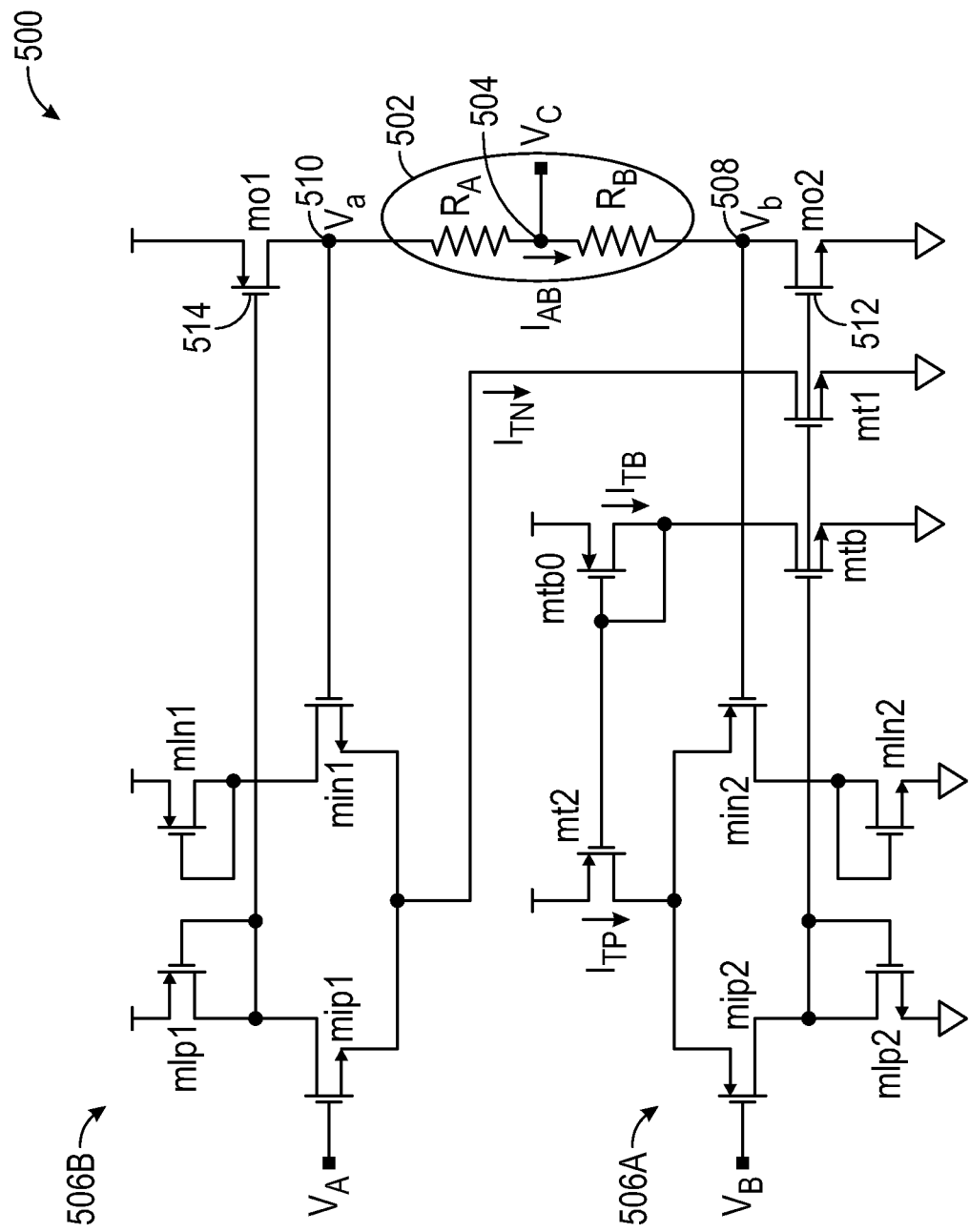
FIG. 5 is another example of a circuit to generate an interpolated voltage using various techniques of this disclosure.

FIG. 5 is another example of a circuit to generate an interpolated voltage using various techniques of this disclosure. The circuit 500 of FIG. 5 can generate an output voltage $V_C$, e.g., an interpolated output voltage. The circuit 500 is a complementary version of the circuit 300 of FIG. 3. The circuit 500 can include a voltage divider 502 including at least a first resistive device $R_A$ and a second resistive device $R_B$, where the output voltage $V_C$ is generated at a node 504 along the voltage divider 502.

The circuit 500 can include a first closed-loop amplifier circuit 506A and a second closed-loop amplifier circuit 506B. The first closed-loop amplifier circuit 506A can be formed by transistors mip2, min2, mlp2, mln2, mo2, mt2, mtb0, and mtb and can drive a first terminal 508 of the voltage divider 502. The first closed-loop amplifier circuit 506A can receive a first reference voltage $V_B$ by the transistor mip2 without loading the first reference voltage $V_B$ at the frequencies of interest. The output voltage Vb can be fed back to the transistor min2. The first closed-loop amplifier circuit 506A can be configured to derive first biasing currents from a current through the voltage divider 502, as described in more detail below.

The second closed-loop amplifier circuit 506B, can be formed by transistors mip1, min1, mlp1, mln1, mo1, and mt1 and can drive a second terminal 510 of the voltage divider 502. The second closed-loop amplifier circuit 506B can receive a second reference voltage $V_A$ by the transistor mip1 without loading the second reference voltage $V_A$ at the frequencies of interest. The output voltage Va can be fed back to the transistor min1. It is assumed $V_B \geq V_A$, without loss of generality. The second closed-loop amplifier circuit 506B can be configured to derive second biasing currents from the current through the voltage divider 502, as described in more detail below.

In some examples, at least one of the first closed-loop amplifier circuit 506A and the second closed-loop amplifier circuit 506B can include a differential amplifier circuit. For example, the input stage of the first closed-loop amplifier circuit 506A can be formed by a differential input transistor pair mip2-min2, a differential load transistor pair mlp2-min2, and a tail current source transistor mt2. The first closed-loop amplifier circuit 506A can be a simple differential amplifier with passive load that drives the output stage transistor mo2 of the first closed-loop amplifier circuit 506A. A negative feedback loop can be formed by transistors min2, mip2, and mo2 and can force, assuming it is stable, the reference voltage $V_B$ value into the output of the first closed-loop amplifier circuit 506A (which is one of the extremes $V_b$ of the voltage divider 502), while the output transistor mo2 delivers the corresponding load current $I_{AB}$.

As mentioned above, the first closed-loop amplifier circuit 506A can be configured to derive first biasing currents from a current through the voltage divider 502. For example, first biasing currents for the transistors mip2 and min2 in FIG. 5 can be generated from a first tail current $I_{TP}$. The first closed-loop amplifier circuit 506A can include a first tail current circuit, e.g., transistors mtb, mtb0, and mt2, to provide the first tail current Ir. The first tail current $I_{TP}$ provided by the transistor mt2 for the operation of the differential input pair mip2-min2 in the input stage of the first closed-loop amplifier circuit 506A is a scaled version of the load current $I_{AB}$ through the voltage divider 502, after being conveyed by transistors mtb and mtb0, which form a current mirror.

The first closed-loop amplifier circuit 506A can include a first output transistor mo2 driving the voltage divider 502 and having a first gate terminal 512. The first tail current circuit can generate the first tail current $I_{TP}$ in response to a voltage at the first gate terminal 512 of the first output transistor mo2. This additional negative feedback loop can balance the input stage loads by making their bias currents track the load current $I_{AB}$, thus helping mitigate the systematic errors that would prevent the output voltage $V_b$ from approaching the first reference voltage $V_B$ without the need for significant open-loop gain in the first closed-loop amplifier circuit 506A.

Similarly, the second closed-loop amplifier circuit 506B can include a differential amplifier circuit. For example, the input stage of the second closed-loop amplifier circuit 506B can be formed by the differential input transistor pair mip1-min1, its differential load transistor pair mlp1-mln1, and its tail current source transistor mt1. The second closed-loop amplifier circuit 506B can be a simple differential amplifier with passive load that drives the output stage of the second closed-loop amplifier circuit 506B formed by the transistor mo1. The negative feedback loop formed by transistors min1, mip1 and mo1 forces, assuming it is stable, the second reference voltage $V_A$ value into the output of the second closed-loop amplifier circuit 506B (which is one of the extremes $V_a$ of the voltage divider 502), while the output transistor mo1 delivers the corresponding load current $I_{AB}$. The second closed-loop amplifier circuit 506B can include a second output transistor mo1 driving the voltage divider 502 and having a second gate terminal 514.

The second closed-loop amplifier circuit 506B can be configured to derive second biasing currents from the current through the voltage divider 502. For example, second biasing currents for the transistors mip1 and min1 in FIG. 5 can be generated from a first tail current Ir. The second closed-loop amplifier circuit 506B can include a second tail current circuit, e.g., transistor mt1, to provide the second tail current $I_{TN}$. The second tail current IN provided by the transistor mt1 for the operation of the differential input pair mip1-min1 in the input stage of the second closed-loop amplifier circuit 506B is a scaled version of the load current $I_{AB}$ through the voltage divider 502. The second tail current circuit can generate the second tail current $I_{TN}$ in response to a voltage at the first gate terminal 512 of the first output transistor mo2.

Complementary output transistors mo1 and mo2 can drive the load (in this case, the voltage divider 502) in such a way that the load current $I_{AB}$ flowing through them approaches the current given by Eq. 2. Ignoring the possible residual errors, the action of the first closed-loop amplifier circuit 506A and the second closed-loop amplifier circuit 506B can produce $V_b \approx V_B$ and $V_a \approx V_A$, respectively. Therefore, the output voltage $V_C$, e.g., an interpolated output voltage, can follow Eq. 1 as targeted.

Figure 6:
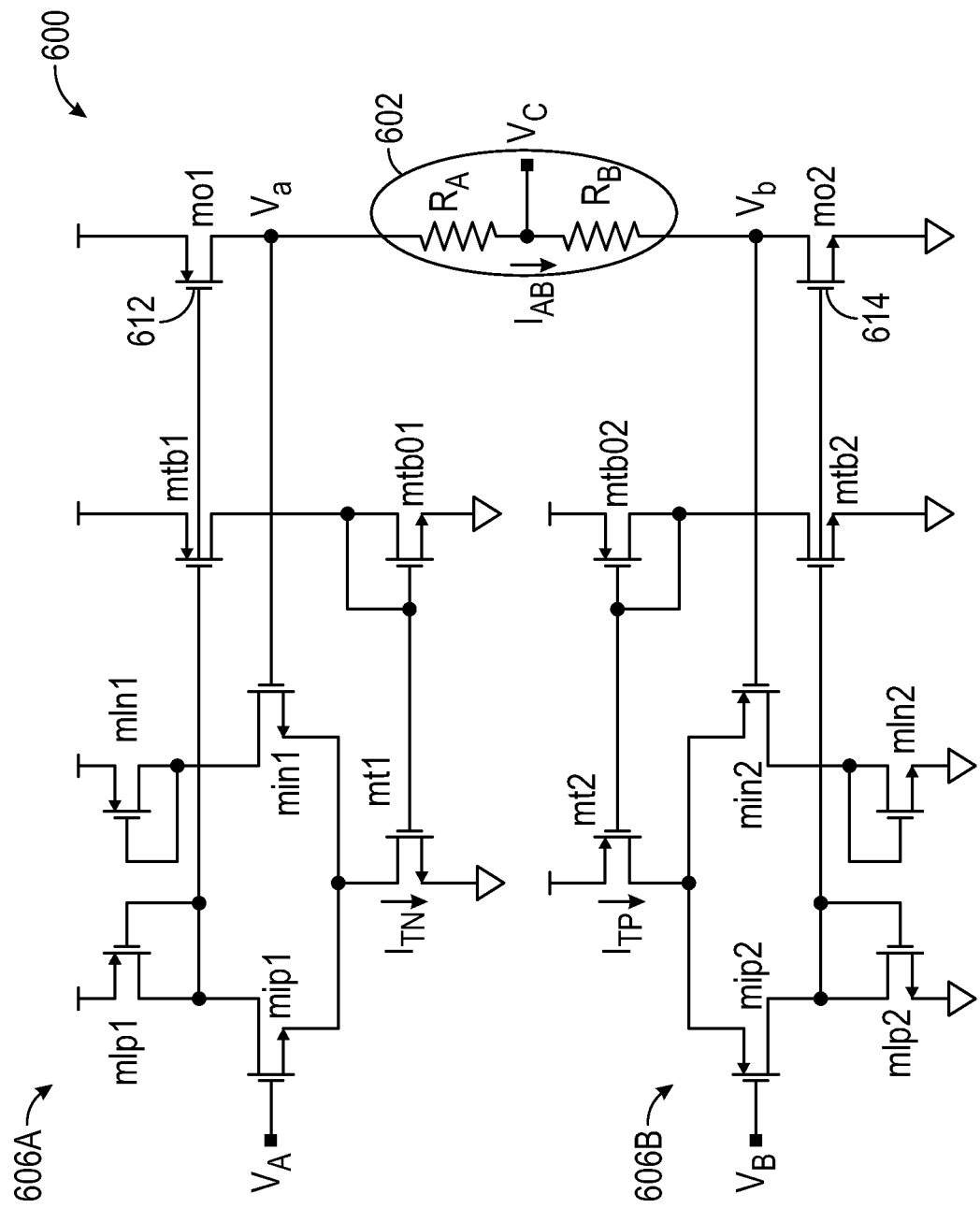
FIG. 6 is another example of a circuit to generate an interpolated voltage using various techniques of this disclosure.

FIG. 6 is another example of a circuit to generate an interpolated voltage using various techniques of this disclosure. In the circuit 600 of FIG. 6, the first and second closed-loop amplifier circuits 606A, 606B can be biased from the current $I_{AB}$ through the voltage divider 602 by mirroring their corresponding output transistor mo1, mo2. This is in contrast to the circuit 300 of FIG. 3 and the circuit 500 of FIG. 5 in which the biasing currents for both of the closed-loop amplifier circuits were derived using one of the two output transistors. For example, in FIG. 3, the biasing currents of both the first closed-loop amplifier circuit 306A and the second closed-loop amplifier circuit 306B can be derived using the voltage on the first gate terminal 312 of the first output transistor mo1.

In FIG. 6, the first closed-loop amplifier circuit 606A can include a first output transistor mo1 having a first gate terminal 612. A first tail current circuit can include transistors mtb1, mtb01, and mt1 and can generate a first tail current $I_{TN}$ in response to a voltage at the first gate terminal 612 of the first output transistor mo1. The second closed-loop amplifier circuit 606B can include a second output transistor mo2 having a second gate terminal 614. A second tail current circuit can include transistors mtb2, mtb02, and mt2 and can generate a second tail current $I_{TP}$ in response to a voltage at the second gate terminal 614 of the second output transistor mo2. The configuration in FIG. 6 is in contrast to the circuit in FIG. 3, for example, where a second tail current can be generated in response to the first gate terminal 612 of the first output transistor mo1.

Figure 7:
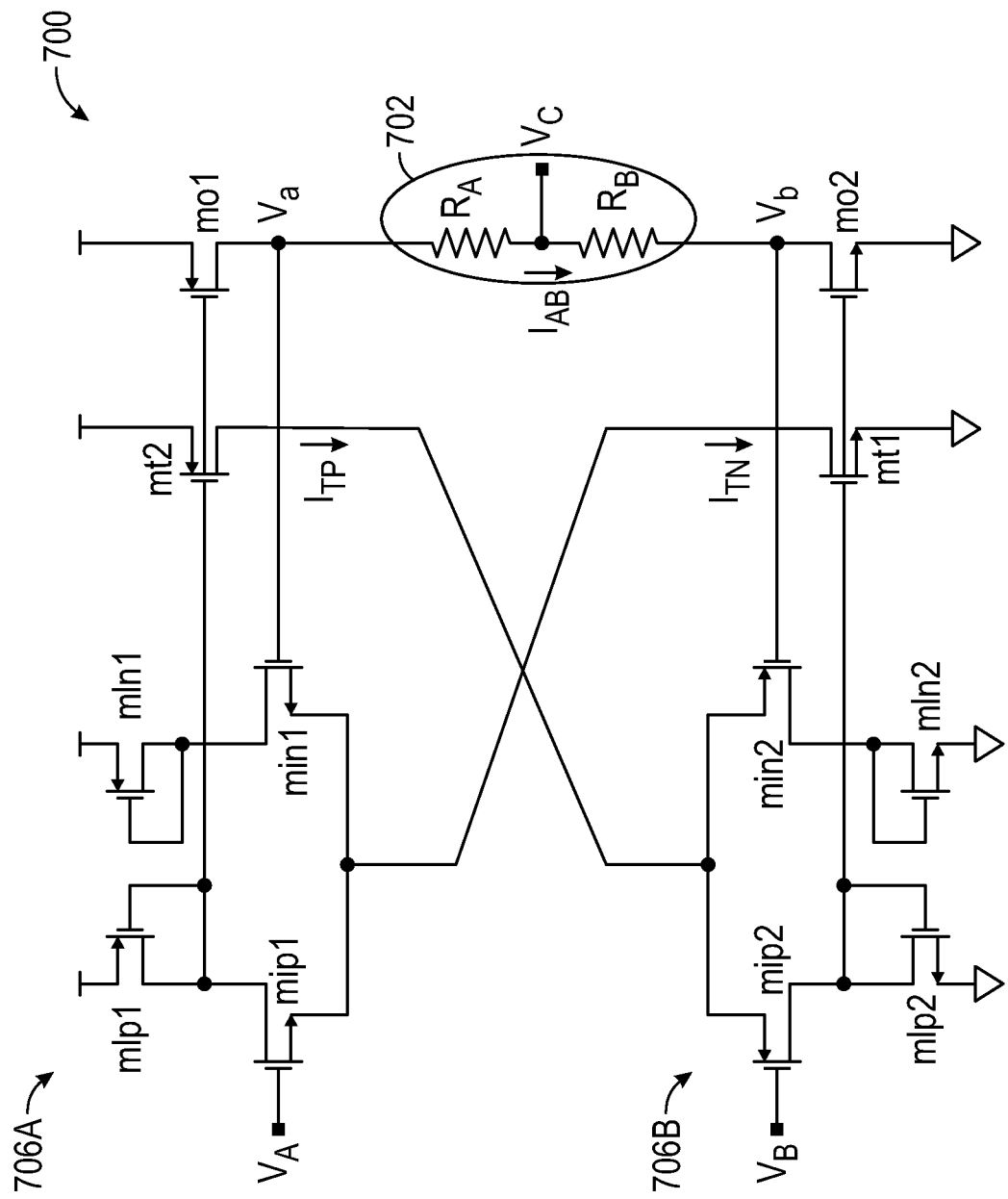
FIG. 7 is another example of a circuit to generate an interpolated voltage using various techniques of this disclosure.

FIG. 7 is another example of a circuit to generate an interpolated voltage using various techniques of this disclosure. The circuit 700 is a more compact and symmetric circuit as compared to the asymmetric circuits of FIGS. 3 and 5, for example. The circuit 700 can include a voltage divider 702, a first closed-loop amplifier 706A, and a second closed-loop amplifier 706B.

The circuit 300 of FIG. 3 included a circuit branch having transistors mtb and mtb0 that has been removed in the circuit 700 of FIG. 7. Like in FIG. 3, for example, the first closed-loop amplifier 706A of FIG. 7 can include a first output transistor mo1 and the second closed-loop amplifier 706B can include a second output transistor mo2. In contrast to the circuit 300 of FIG. 3, the tail current $I_{TP}$ for the second closed-loop amplifier 706B can be generated by mirroring the first output transistor mo1, e.g., using the transistor mt2, and the tail current $I_{TN}$ for the first closed-loop amplifier 706A can be generated by mirroring the second output transistor mo2, e.g., using the transistor mt1.

Figure 8:
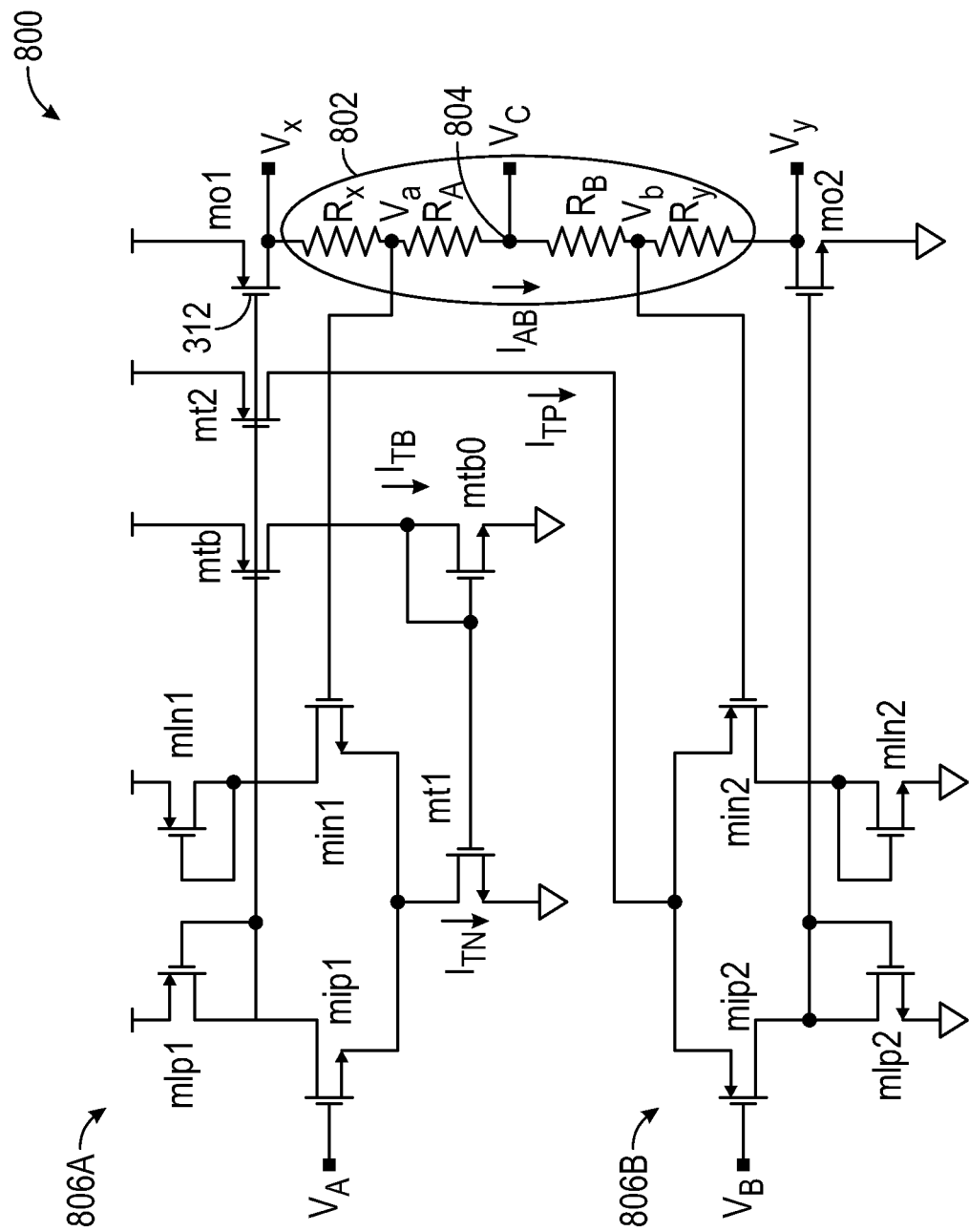
FIG. 8 is another example of a circuit to generate an output voltage using various techniques of this disclosure.

FIG. 8 is another example of a circuit to generate an output voltage using various techniques of this disclosure. The circuit 800 can generate either an interpolated output voltage or an extrapolated output voltage, where an extrapolated output voltage can be generated at a node 804 of the voltage divider 802, and wherein the extrapolated voltage extends outside a range of output voltages $V_a$, $V_b$ of the first closed-loop amplifier 806A and the second closed-loop amplifier 806B. The circuit 800 of FIG. 8 can extrapolate values beyond $V_A$ and $V_B$ by extending the voltage divider 802 beyond the amplifiers' outputs $V_a$ and $V_b$, and tapping voltages like $V_x > V_A$ and $V_y < V_B$ as shown, for example, in FIG. 8 by the addition of resistive elements Rx and Ry, respectively.

The circuit shown in FIGS. 3, 5, 6, 7, and 8 can be adapted to interpolate not only the average between the reference voltages $V_A$ and $V_B$ but any intermediate value ($V_B \geq V_C \leq V_A$) by adjusting the relative resistances of resistors $R_A$ and $R_B$. In practice, this can mean tapping the output voltage $V_C$ at a different node, e.g., node $V_x$ or $V_y$, along the voltage divider 802.

The descriptions of the voltage interpolator circuits above adopted the typical case in which the reference voltages are buffered with a unity gain. However, in general, the techniques of this disclosure can be adapted to apply a different gain factor to expand or reduce the range of available interpolation (or extrapolation values). Moreover, the amplification can be asymmetrical between both amplifiers, producing the corresponding shift in the available interpolation/extrapolation range.

The voltage interpolator techniques described in this disclosure can be used as a standalone circuit or as part of a more complex system. This disclosure has implicitly focused on the case of integrated circuits. However, the techniques are also applicable to discrete circuits or combinations of integrated circuits and discrete circuits.

In addition, although shown and described using field-effect transistors (FET), the techniques of this disclosure can be readily adapted to other known semiconductor technologies, such as bipolar junction transistors.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A circuit to generate an output voltage, the circuit comprising:
    a voltage divider including at least a first resistive device and a second resistive device, wherein the output voltage is generated at a node along the voltage divider;
    a first closed-loop amplifier circuit to:
        drive a first terminal (Va) of the voltage divider; and
        receive a first reference voltage (VA),
        wherein the first closed-loop amplifier circuit is configured to derive first biasing currents from a current through the voltage divider; and
    a second closed-loop amplifier circuit to:
        drive a second terminal (Vb) of the voltage divider; and
        receive a second reference voltage (VB),
        wherein the second closed-loop amplifier circuit is configured to derive second biasing currents from the current through the voltage divider.

2. The circuit of claim 1, wherein at least one of the first closed-loop amplifier circuit and the second closed-loop amplifier circuit is a differential amplifier circuit.

3. The circuit of claim 1, wherein the first closed-loop amplifier circuit includes a first tail current circuit to generate a first tail current that is a scaled version of the current through the voltage divider.

4. The circuit of claim 3, wherein the first closed-loop amplifier circuit includes a first output transistor driving the voltage divider and having a first gate terminal, the first tail current circuit to generate the first tail current in response to a voltage at the first gate terminal of the first output transistor.

5. The circuit of claim 4, wherein the second closed-loop amplifier circuit includes a second tail current circuit to generate a second tail current that is a scaled version of the current through the voltage divider.

6. The circuit of claim 5, the second tail current circuit to generate the second tail current in response to the voltage at the first gate terminal of the first output transistor.

7. The circuit of claim 5, wherein the second closed-loop amplifier circuit includes a second output transistor having a second gate terminal, the second tail current circuit to generate the second tail current in response to a voltage at the second gate terminal of the second output transistor.

8. The circuit of claim 3, wherein the first tail current circuit includes a current mirror.

9. The circuit of claim 1, wherein the first closed-loop amplifier includes a first output transistor, wherein the second closed-loop amplifier includes a second output transistor, the second closed-loop amplifier to generate a tail current by mirroring the first output transistor, and the first closed-loop amplifier to generate a tail current by mirroring the second output transistor.

10. The circuit of claim 1, wherein the output voltage is between output voltages of the first closed-loop amplifier and the second closed-loop amplifier.

11. The circuit of claim 1, wherein the output voltage is generated at a node of the voltage divider that extends outside a range of output voltages of the first closed-loop amplifier and the second closed-loop amplifier.

12. A method of generating an output voltage using a circuit including a voltage divider having at least a first resistive device and a second resistive device, wherein the output voltage is generated at a node along the voltage divider, the method comprising:
  driving a first terminal (Va) of the voltage divider;
  receiving a first reference voltage (VA);
  deriving first biasing currents from a current through the voltage divider;
  driving a second terminal (Vb) of the voltage divider;
  receiving a second reference voltage (VB); and
  deriving second biasing currents from the current through the voltage divider.

13. The method of claim 12, comprising:
  generating a first tail current that is a scaled version of the current through the voltage divider.

14. The method of claim 13, wherein generating the first tail current includes:
  generating the first tail current in response to a voltage at a first gate terminal of a first output transistor.

15. The method of claim 14, comprising:
  generating a second tail current that is a scaled version of the current through the voltage divider.

16. The method of claim 15, wherein generating the second tail current includes:
  generating the second tail current in response to the voltage at the first gate terminal of the first output transistor.

17. The method of claim 14, comprising:
  generating a second tail current in response to a voltage at a second gate terminal of a second output transistor.

18. A circuit to generate an output voltage, the circuit comprising:
  a voltage divider including at least a first resistive device and a second resistive device, wherein the output voltage is generated at a node along the voltage divider;
  a first closed-loop amplifier circuit including a first output transistor driving the voltage divider and having a first gate terminal, the first closed-loop amplifier circuit to:
    drive a first terminal (Va) of the voltage divider; and
    receive a first reference voltage (VA),
    wherein the first closed-loop amplifier circuit is configured to derive first biasing currents from a current through the voltage divider; and
  a second closed-loop amplifier circuit to:
    drive a second terminal (Vb) of the voltage divider; and
    receive a second reference voltage (VB),
    wherein the second closed-loop amplifier circuit is configured to derive second biasing currents from the current through the voltage divider,
  wherein the first closed-loop amplifier circuit includes a first tail current circuit to generate a first tail current in response to a voltage at the first gate terminal of the first output transistor, and wherein the first tail current is a scaled version of the current through the voltage divider.

19. The circuit of claim 18, wherein the second closed-loop amplifier circuit includes a second tail current circuit to generate a second tail current that is a scaled version of the current through the voltage divider.

20. The circuit of claim 19, the second tail current circuit to generate the second tail current in response to the voltage at the first gate terminal of the first output transistor.

* * * * *